United States Patent
Brennan

(10) Patent No.: US 7,636,281 B2
(45) Date of Patent: Dec. 22, 2009

(54) REPLAYING DIGITAL MEDIA

(75) Inventor: Martin John Brennan, Newmarket (GB)

(73) Assignee: GS IP Limited Liability Company, Wilmington, DE (US)

( * ) Notice: Subject to any disclaimer, the term of this patent is extended or adjusted under 35 U.S.C. 154(b) by 715 days.

(21) Appl. No.: 10/398,550

(22) PCT Filed: Oct. 3, 2001

(86) PCT No.: PCT/GB01/04405

§ 371 (c)(1),
(2), (4) Date: Sep. 2, 2003

(87) PCT Pub. No.: WO02/29805

PCT Pub. Date: Apr. 11, 2002

(65) Prior Publication Data

US 2004/0037371 A1 Feb. 26, 2004

(30) Foreign Application Priority Data

Oct. 4, 2000 (GB) ................................. 0024293.3

(51) Int. Cl.
*G11B 7/00* (2006.01)
(52) U.S. Cl. .............. 369/47.32; 369/47.31; 369/53.35; 369/30.23; 369/47.2
(58) Field of Classification Search ....................... None
See application file for complete search history.

(56) References Cited

U.S. PATENT DOCUMENTS

| 4,614,497 A | | 9/1986 | Kurz |
| 4,796,100 A | | 1/1989 | Sakaguchi |
| 5,138,925 A | | 8/1992 | Koguchi et al. |
| 5,457,673 A | * | 10/1995 | Nakamura et al. ....... 369/53.35 |
| 5,502,696 A | * | 3/1996 | Yoon et al. ............... 369/30.25 |
| 5,982,294 A | | 11/1999 | Takayama et al. |
| 6,035,428 A | * | 3/2000 | Jekal ........................... 714/702 |
| 6,044,225 A | | 3/2000 | Spencer et al. |
| 6,061,760 A | | 5/2000 | Huang |
| 6,108,812 A | | 8/2000 | Born |

(Continued)

FOREIGN PATENT DOCUMENTS

CN 1246991 A 3/2000

(Continued)

OTHER PUBLICATIONS

English Abstract of JP 08-096512.

(Continued)

*Primary Examiner*—Wayne R Young
*Assistant Examiner*—Lixi Chow
(74) *Attorney, Agent, or Firm*—McDonnell Boehnen Hulbert & Berghoff LLP

(57) ABSTRACT

A reading unit for reading data from a digital data carrier, the reading unit comprising: a reading head including a sensor for sensing data from the data carrier and generating a sensor signal indicative for the sensed data; head positioning apparatus for positioning the head relative to the data carrier in response to a head positioning control signal; a head positioning controller for receiving the sensed data and being operable in accordance with a stored instruction set to process the sensed data to generate the head positioning control signal; and a data decoder for decoding the sensed data to form a digital output signal.

16 Claims, 7 Drawing Sheets

U.S. PATENT DOCUMENTS

| | | | |
|---|---|---|---|
| 6,182,265 | B1 | 1/2001 | Lim et al. |
| 6,192,493 | B1 | 2/2001 | Combelles et al. |
| 6,223,322 | B1 | 4/2001 | Michigami et al. |
| 6,346,896 | B1 | 2/2002 | Su et al. |
| 6,449,231 | B1 * | 9/2002 | Numata ............ 369/53.2 |
| 6,538,967 | B1 * | 3/2003 | Lee ............ 369/47.46 |
| 6,574,174 | B1 * | 6/2003 | Amble et al. ............ 369/44.26 |
| 6,631,491 | B1 | 10/2003 | Shibutani et al. |

FOREIGN PATENT DOCUMENTS

| | | |
|---|---|---|
| CN | 01818196.1 | 10/2005 |
| EP | 0492938 A2 | 7/1992 |
| EP | 0552979 | 7/1993 |
| GB | 2363556 A | 12/2001 |
| JP | 43333/1989 | 9/1989 |
| JP | 08096512 | 4/1996 |
| JP | 9153259 A | 6/1997 |
| JP | 09238087 | 9/1997 |
| JP | 11088199 | 3/1999 |
| JP | 2000-112881 | 4/2000 |
| KR | 248396 | 3/2000 |
| WO | 97/05702 | 2/1997 |
| WO | WO 98/43243 | * 10/1998 |

OTHER PUBLICATIONS

English Abstract of JP 09-153259.
Office Action Mailed Mar. 10, 2009 for U.S. Appl. No. 11/613,752.

* cited by examiner

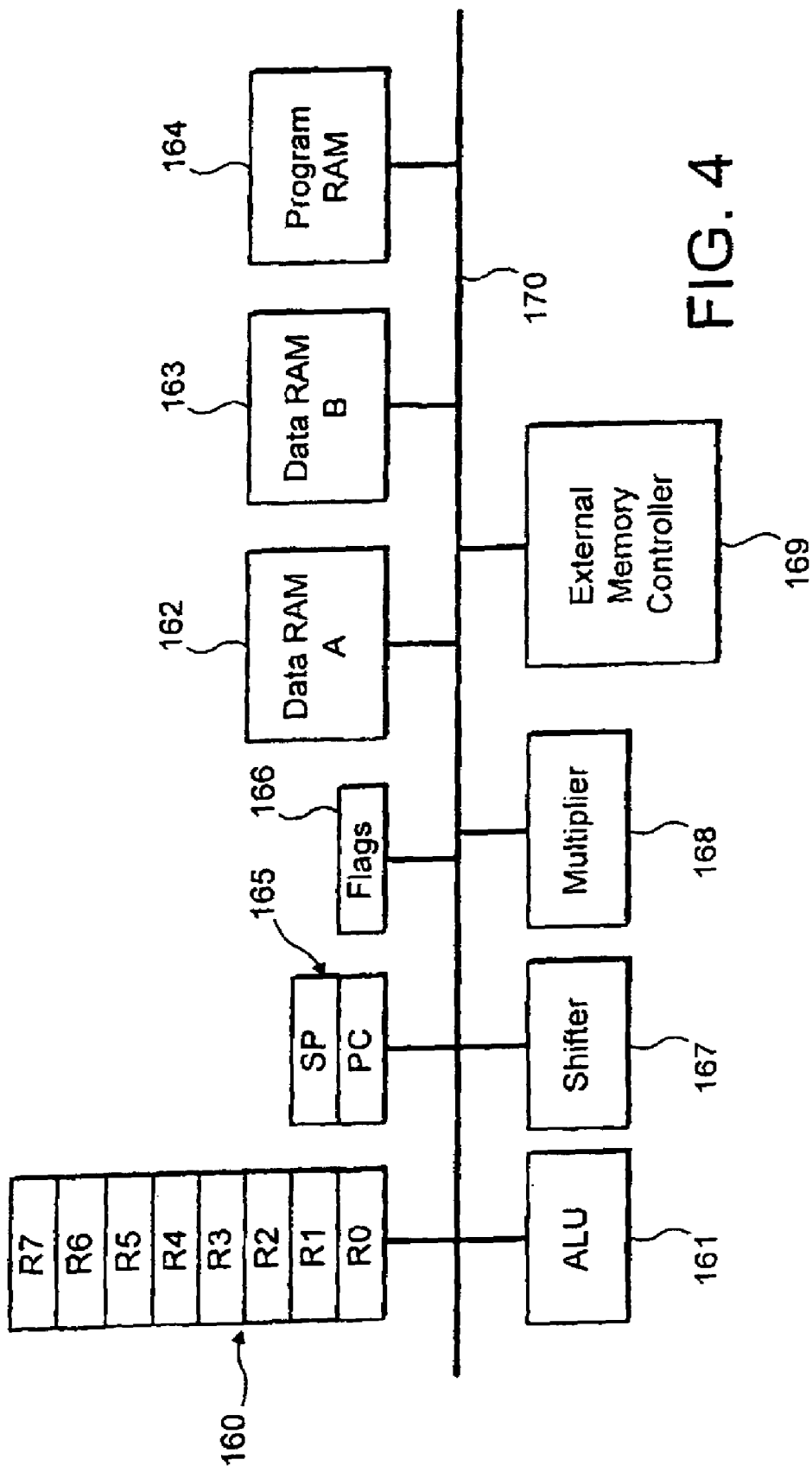

REPLAYING DIGITAL MEDIA

This invention relates to reading digital media such as compact discs (CDs) and processing the data derived therefrom.

FIG. 1 shows the typical architecture of a CD reader and decoder for use in replaying an audio CD. The compact disc is illustrated at 500. A reading unit 501 is movable radially relative to the CD by means of a motor 502 and axially relative to the CD for focussing purposes by means of a motor 503. A motor 504 spins the CD so that it rotates over the reading unit. The reading unit comprises a laser 505 directed at the surface of the CD and a number of sensors 506 that provide outputs indicative of the data read from the CD and the degree of focus of the head relative to the CD. The output from the sensors of the head, which is in analogue form, is indicated generally at 507.

The output is passed to a control unit 508 which uses the sensed information to control the radial travel and focus of the head by means of motors 502 and 503 and the spin speed of the CD by means of motor 504. The control unit 508 is conventionally implemented as an integrated circuit, predominantly of analogue processing components.

The output is also passed to a data processing unit 509 which processes the sensed information to form a digital output stream carrying the digital audio data derived from the CD. In accordance with the conventional CD CIRC (cross-interleaved Reed Solomon error correction) decoding process the data processing unit 509 implements a digital phase-locked loop (PLL), carries two levels of deinterleaving and two levels of Reed-Solomon error correction (C1 and C2) decoding and finally generates a digital output in I2S (inter-IC-sound) format at 510 for transmission to subsequent processing devices. The control unit 509 is conventionally implemented as another integrated circuit, predominantly of digital processing components.

In a conventional implementation the units 508 and 509 are implemented on separate integrated circuits (ICs). Since the unit 508 is predominantly an analogue processing circuit and the unit 509 is predominantly a digital processing circuit it is highly advantageous to separate them in that way for ease and economy of manufacture of the ICs. However, at the stage of assembling the CD player the use of two separate integrated circuits calls for considerable circuit board area.

According to one aspect of the present invention there is provided a reading unit for reading data from a digital data carrier, the reading unit comprising: a reading head including a sensor for sensing data from the data carrier and generating a sensor signal indicative for the sensed data; head positioning apparatus for positioning the head relative to the data carrier in response to a head positioning control signal; head positioning controller for receiving the sensed data and being operable in accordance with a stored instruction set to process the sensed data to generate the head positioning control signal; and a data decoder for decoding the sensed data to form a digital output signal, the data decoder comprising: a software section comprising a data processor operable to process data generated in response to the sensed data in accordance with a stored instruction set; and a hardware section comprising dedicated hardware for performing at least one of the following: a digital phase locked loop for generating a clock signal for synchronisation of the decoder with the sensed data; an error checking unit for performing polynomial division; a cyclic redundancy check unit for analysing a data word to perform a cyclic redundancy check on it; a data packaging unit for packaging data bytes comprising a first number of bits so as to form data bytes having a second, lesser number of bits, and a deinterleaving unit for deinterleaving a stream of data bytes.

The hardware section and the software section are suitably implemented on a single integrated circuit. This allows the processing steps and the circuit board area required for its installation can be reduced in comparison to the prior art arrangement described above.

Preferably the digital data carrier is a disc, for instance a compact disc, digital versatile disc or minidisc.

The head positioning apparatus may comprise a spindle motor for rotating the data carrier.

The error checking unit is suitably capable of receiving error checking input data and in response to the error checking input data generating a syndrome for use in Reed-Solomon error correction. The software section is then suitably capable of applying data derived from the sensed data to the error checking unit, receiving the resultant syndrome and processing the syndrome to perform an error checking operation on the data derived from the sensed data.

The reading unit suitably comprises a buffer for storing data derived from the sensed data. The buffer may be a dedicated buffer for storing data derived from the sensed data.

The data packaging unit is suitably adapted to receive a 14-bit byte and in response generate a corresponding 8-bit byte. The data packaging unit preferably comprises logical processing circuitry for generate a corresponding 8-bit byte in response to a received 14-bit byte. Alternatively, the data packaging unit may be adapted to perform a look-up operation.

Preferably the deinterleaving unit comprises three buffer areas, and the deinterleaving unit is adapted to receive a stream of data bytes and to simultaneously store successive received data bytes in any one of the buffers and generate an output data stream in which successive data bytes are formed by reading data from alternate ones of the other two of the buffers.

According to a second aspect of the present invention there is provided a method for deinterleaving data, by means of a storage unit comprising three buffer areas, the method comprising: receiving a data stream comprising a plurality of data bytes; storing a predetermined number of successive data bytes of the data stream in a first one of the buffer areas; storing the predetermined number of successive data bytes of the data stream in a second one of the buffer areas; and simultaneously: storing the predetermined number of successive data bytes of the data stream in a third one of the buffer areas; and alternately reading data bytes from the first and second buffer areas to form an output data stream.

The method suitably comprises the steps of, once the predetermined number of successive data bytes of the data stream has been stored in one of the buffer areas and all data bytes have been read from the other buffer areas: storing the predetermined number of successive data bytes of the data stream in one of the said other buffer areas; and subsequently: simultaneously storing the predetermined number of successive data bytes of the data stream in the other of the said other buffer areas, and alternately reading data bytes from the said one of the buffer areas and the said one of the said other buffer areas.

The present invention will now be described by way of example, with reference to the accompanying drawings, in which:

FIG. 4 illustrates the architecture of the digital signal processor of the integrated circuit of FIG. 3.

In the drawings, like reference numerals indicate like parts.

Figure 1:
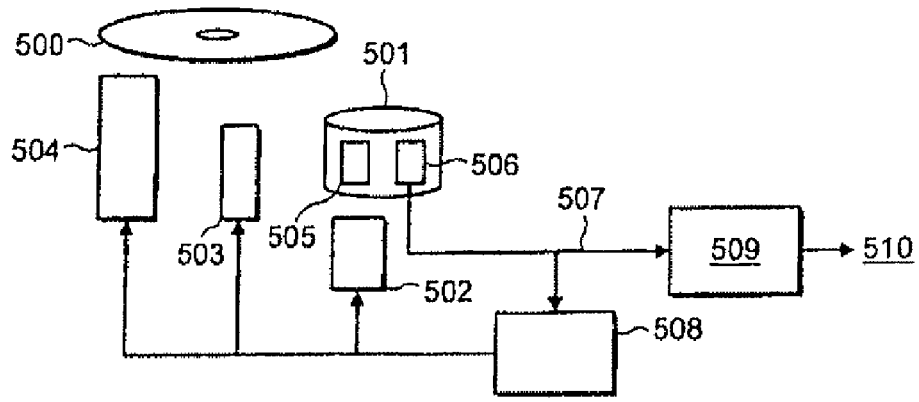
FIG. 1 shows the architecture of a prior art CD reading assembly.

The audio system of FIG. 2 is intended for sound reproduction, for example as a domestic hi-fi system. The audio system comprises audio source devices, control devices and output devices all connected by way of a central microprocessor 1. The central microprocessor performs processing of signals from all audio sources, including analogue audio sources in the digital domain, and interfaces with user interface devices such as a switch matrix and an infra-red remote controller.

The use of a central microprocessor in this way allows a much greater level of integration than in prior systems. As a result, fewer components are required, manufacturing and testing is easier, and the size and cost of the resulting system can be reduced. Furthermore, with a system of this type it can be possible to define the functionality of the system by means of software, so that a single hardware unit can be manufactured in quantity and adapted for specific implementations by means of the software running on it The audio source devices are a radio tuner shown generally at 2, a compact disc player shown generally at 3 and a cassette player and recorder shown generally at 4. Further devices such as (but not limited to) DVD, mini-Disc or MP3 players and/or recorders, television receivers and microphones could also provide audio input.

The radio tuner 2 comprises FM (frequency modulation) antenna 200 and AM (amplitude modulation) antenna 201. Signals from the FM antenna are demodulated in the FM demodulation section 202 by means of mixing with a tuning signal at 203 which is derived from a synthesizer 204 under the control of the central microprocessor 1; and decoded into left and right stereo signal by stereo decoder 206. The stereo decoder may conveniently be implemented on the same or another IC as the other components. The resulting analogue audio signals are passed at 207 to codec unit 5. Variable capacitance diodes 208 are used to tune the AM reception under the control of a tuning signal at 209 which is derived via synthesizer 204 from a serial controller 20. The received AM signals are decoded to yield an analogue audio signal which is passed at 213 to codec unit 5. Selection of FM or AM reception is by means of signal switching under the control of selection signal 214 from the serial controller 20. Thus the radio tuner section is capable of receiving signals at a selected FM or AM frequency under the control of serial controller 20, and generating audio output signal(s) which are passed to the codec unit 5.

The compact disc (CD) player 3 has conventional data detection hardware comprising a pair of laser diodes 301, tracking and focus motors 302, 303 and six detection diodes 304-309. The laser diodes are enabled by an enable signal at 310 from the serial controller 20. The tracking, focus, sled and spindle drives are controlled by noise shaped DAC digital control signals 311, 312, 312a and 312b from the central microprocessor. Each of those control signals is converted to analogue by low-pass filter R-C network 313, 314, 314a, 314b to provide a respective drive signal at 319, 320. Outputs from the detection diodes 304-309 are amplified and passed to a decoding unit 321 including low pass filters and sum/difference circuitry to generate four analogue outputs at 322-324, 324a. These are converted to digital bitstreams by sigma-delta modulators 325-327, 327a to form four digital signals at 328-330, 328a which are passed to the central microprocessor 1. The four bitstreams are used for recovering the data read from a CD and for bringing the reading head into proper focus and tracking alignment with the CD. Thus, when enabled by serial controller 20 the CD player is capable of reading a CD under the control of digital signals 311 I 312, 312a, 312b from the central microprocessor and returning digital data bitstreams to the microprocessor. The driving of the CD and its carrying tray is performed normally by motors which are not shown in FIG. 1.

In the present embodiment the control of the focus, spindle and tracking motors as well as the decoding of data read from the CD is performed by the central microprocessor. Thus, in contrast to the system illustrated in FIG. 1, separate integrated circuits are not implemented for the control and decoding operations. Instead, the CD decoding operations are performed in the CD decoder unit 520 of the central microprocessor 1, with support from the ECC accelerator 521, and the control operations are performed in the focus and tracking control unit 522 of the microprocessor 1.

The servo motor control operations, including the spindle speed control operation, are performed in software by the focus and tracking control unit 522 of the central microprocessor using digital hardware. Because of this it is convenient to implement the servo motor control operations on the predominantly digital central microprocessor. The software instructions for the operation of the focus and tracking control unit may be stored in the unit itself or on off-chip RAM 16.

The software for operation of the CD servos comprises basically 3 sections: a focus section, a spindle motor control section and a tracking section. When a CD is loaded into the player, the following steps are performed under the control of the software:

The spindle motor is set to a nominal constant speed.

The that carries the read head is moved to the centre of the disc.

The head coils that control the focusing of the head are set in their mid position.

Focus calibration is undertaken by moving the head is in and out until focus is detected and determining the range of drive required for this.

With this range information the continuous focus servo is enabled.

Using the CD phase locked loop aligned to the CD data coming from the focussed head the spindle motor speed is controlled to provide constant speed raw CD data at 4.32 MHz.

At this time the individual track tracking section of the servo software is enabled. In essence this enables the head (by means of the head magnetic coils and then the sled) to follow the 1.6 um wide track on the CD surface.

The head follows the initial inner tracks until the table of contents has been read. The information derived from this region includes the numbers of the first and last tracks on the disc, the lead out start time and the track number start times. This information is stored in memory for use in random access to data on the CD either automatically or under user control.

The Spindle then stops and the software awaits a CD play command.

When a play command is received, the stored information is used to determine the location on the CD at which reading of data should commence. The spindle motor is enabled in order to spin the CD up to speed. The head is positioned at the appropriate location using the sled motor and is focussed by the head coils. Then data reading commences and the servos are adjusted continuously so that the head follows the track on the CD as the data is read.

The majority of the CD data decoding operations are also performed in software. However, it has been found that a substantial increase in efficiency can be achieved by performing selected steps of the decoding process using dedicated hardware on the central microprocessor. Those steps are the digital PLL, buffering of incoming data, certain error checking operations, and 14-bit to 8-bit packaging.

The digital PLL is implemented directly in hardware in the CD decoder section 520 of the central microprocessor. The digital PLL 550 generates a bit-rate clock that is used for synchronisation of the decoding operation.

Incoming data from the sensors is stored in a dedicated 96-bit buffer 551. In FIG. 2 the buffer 551 is illustrated as being in the CD decoder section, but other memory on the central microprocessor could be used instead. In a conventional digital CD decoder a substantially greater amount of memory, for example 2 kilobytes is allocated for buffering incoming data. However, because of the efficiency of the present system brought about by the division of decoding steps between hardware and software it has been found that 96 bits are adequate in the present embodiment.

Error checking is implemented by a dedicated error-checking accelerator (ECC) section 521 of the central microprocessor. The ECC section is provided with dedicated hardware for performing polynomial division in order to accelerate the Reed-Solomon decoding step necessary in decoding of data off CD. In addition it is provided with dedicated hardware for generation of cyclic redundancy check (CRC) data in accordance with CD standards by performing an exclusive-OR operation on data passed to it.

CD data is encoded in 14-bit bytes, which must be packaged down to 8-bit format to form the final digital data stream. Conventionally this is performed by means of a look-up table in which the corresponding 8-bit word is yielded by looking up the initial 14-bit byte. In the present embodiment logic hardware is provided instead of a look-up table. The logic hardware is arranged to process a 14-bit byte input to it so as to generate the corresponding 8-bit byte as output.

The deinterleaving process is performed using three blocks of memory, 560, 561, 562. Data bytes that have been packaged down to 8-bits are written sequentially to the first block. 560. Once that block is full incoming data bytes are written sequentially to the second block 561. Once that bock is full incoming data bytes are written to sequentially to the third block 562. As incoming data is being written to the third block 562 odd and even bytes are extracted in turn from the first and second blocks so as to effect deinterleaving of the data. The rate of data extraction is higher than the rate at which the blocks are filled, so that the data has been extracted from the first and second blocks before the third block has been filled. Once the third block 562 has been filled incoming data is written to the first block 560. Once the first block 560 has been filled data is written to the second block 561 whilst the data stored in the third and first blocks is extracted and de-interleaved. Then the third block is filled and then the cycle repeats as data is written to the first block whilst data is extracted from the second and third blocks. In this way deinterleaving can be performed highly efficiently using relatively little buffer space.

Each of the buffers 560, 561 and 562 has a capacity of 32 bytes (symbols). As data is received from the CD reading system it is written by DMA (direct memory access) into the appropriate one of the buffers. The CPU then reads alternate locations in a pair of the buffers to undertake the de-interleave process. Thus the CPU effectively undertakes the de-interleave function by the arrangement of the memory accesses.

When the data is de-interleaved, error correction software is run on the CPU to perform error correction.

To perform the interleaving process an even byte is taken from the last-but-one buffer to be filled, followed by an odd byte from the last buffer to be filled. The process is repeated with odd and even bytes respectively. This builds a 32 symbol (byte) frame.

After this step the standardized C1 error correction stage is performed. This is done mostly in software but with hardware assistance from a dedicated error checking calculation unit or ECC accelerator logic unit (119 in FIG. 4). This is essentially a 32 to 28 symbol converter. The ECC unit calculates in hardware syndromes for data passed to it, which it returns to the software for subsequent processing.

The software then performs the main de-interleave process using up to 108 clock delays to minimize the effect of a bad frame and essentially dispersing this to enabling maximum correction and recovery (interpolation) capability.

The standardized C2 process follows. Again, this is performed mostly in software, but still using the ECC logic 119. This does a 28 to 24 symbol conversion.

To complete the process a last de-interleave is performed for even greater interpolation success to cope with surface imperfections on the CD. As a circular buffer technique is used for this, time is available for irrecoverable errors to be muted in time so that no audible 'clicks' are discernable at the audio output. The circular buffer fill rate can also be monitored to effectively give software control corresponding to fine tuning of the CD motor spindle speed control (the basic spindle control is achieved via the DPLL 130).

The cassette player/recorder 4 has a pair of left 400 and right 401 read/write tape heads. The tape read outputs 402, 403 from the heads are amplified by amplifiers 404, 405 and are then passed at 406, 407 as left and right analogue audio signals to codec unit 5. Tape record inputs 408, 409 to the heads are generated by amplifiers 410, 411 from signals at 412, 413 received from I2S interface 10. Thus, the cassette player/recorder is capable of reading a cassette tape to generate audio signals at 406,407 to codec unit 5, and of recording on a cassette tape analogue data derived from digital signals at 414,415 from the microprocessor. The driving of the cassette tape by a motor (not shown), and the operation of an erase head (not shown) is performed normally. More than one cassette mechanism may be supported. Where more than one cassette mechanism is provided, one mechanism may be capable of recording playback from another mechanism.

Serial controller 20 is connected to microprocessor 1 by a serial interface 33. By means of signals sent over that link the microprocessor can control the various outputs of the serial controller.

The control devices of the audio system are switch matrix 7 and remote control handset 8. The switch matrix 7 is fixed to a user-operable keypad. Switch matrix 7 is connected directly to microprocessor 1 by a parallel interface 9. Remote control handset 8 transmits infra-red signals which are received by an infra-red receiver 30 connected to microprocessor 1. The output devices of the audio system are an LCD (liquid crystal display) display block 11 connected directly to the microprocessor 1 and an audio output section comprising left and right power amplifiers 12, 13 and left and right loudspeakers 14, 15. The display may be driven via an external display controller. This may be especially convenient for displays of other technologies, for instance vacuum fluorescent displays or cathode ray tubes. The power amplifiers are driven by left and right analogue audio out signals at 31' 32 from codec 5. A read only memory (ROM) 16 is connected by a bus 17 to the microprocessor 1. The ROM stores software for execution by the processor.

The codec 5 performs D-to-A and A-to-D conversion. The codec 5 has connections to the microprocessor 1 for carrying left and right digital audio input signals to the microprocessor (connections 21,22) and for carrying left and right digital audio output signals from the microprocessor 1 (connections 23,24). The DSP 1 has an I2S interface which can be used to interface to an external DAC if that is preferred, for example for cassette record signals, or PWM (pulse width modulated) noise shaped signals from DSP 1 for DAC conversion using the amplifiers 410, 411. The codec has connections 207, 406, 407 for receiving analogue signals from the radio tuner and the cassette player/recorder, and connections 31' 32 for providing output signals to the power amplifiers 12, 13. The codec also receives a source selection signal at 27 from the microprocessor 1. In response to the source selection signal an A-to-D path 34 in the codec can encode analogue signal(s) from a selected one of the audio sources 2, 4 to generate the left and right digital audio input signals to the microprocessor 1. Simultaneously a D-to-A path 35 in the codec can decode the left and right digital audio output signals from the microprocessor to generate the analogue outputs to the power amplifiers. A standard encoding/decoding scheme is used by the codec.

The interface 10 has connections 414, 415 to the microprocessor 1 for receiving digital signals in I2S format representing left and right digital audio signals. The interface 10 converts those signals to analogue form and outputs them at 412, 413 to the cassette player/recorder for recording.

The architecture of FIG. 1 includes four integrated circuits. One carries the serial controller 20 and the dedicated circuitry for supporting the operation of the radio tuner 2, compact disc player 3 and cassette player/recorder 4. Another carries the interface 10. Another carries the codec 5. The fourth carries the microprocessor 1. Any or all of these may be integrated so that fewer separate integrated circuits are needed. All of the components of the audio system are preferably mounted in a single enclosure, with the exception of the speakers 14, 15, which may be in separate boxes, and the remote control handset 8.

In operation a user selects an audio source using the remote control handset 8 or the switch matrix 7. Left and right channel audio signals from that audio source are provided in digital form to the microprocessor, either in a bitstream format directly from the detection circuitry (if the CD player is the selected source) or in an encoded digital audio format via the codec 5 (if the radio tuner or the cassette player/recorder is selected). In the microprocessor the digital signals are processed as will be described below, for example for volume, tone, equalisation and error correction, to generate left and right channel output signals in digital form at 23, 24. Those signals are then converted to analogue form and used to drive the speakers to give an audible representation of the signals from the data source. If the user selects that the cassette player/recorder is to record data from one of the other audio sources then the microprocessor outputs the signals for recordal in digital form at 28, 29 after D-to-A conversion by I2S interface 10 a representation of the signals is then recorded by the cassette player/recorder. It should be noted that even if the selected source inherently generates analogue signals, as for example do the radio tuner and the cassette deck, their outputs are converted to digital form for digital processing in the processor 1 before being returned to the analogue domain for output to the loudspeakers.

FIG. 2 shows the architecture of the microprocessor 1. The microprocessor includes a multi-purpose digital signal processor (DSP) 100 and a series of dedicated hardware units 101-119. The processor 100 operates to load and execute program code stored in ROM 16. The dedicated hardware units comprise an array of input/output interfaces 101-113, a CD processing sub-system 114, an RDS (radio data system) processing sub-system 115, sigma-delta input circuits 116-118 and an error correction accelerator sub-system (EGG) 119. The processor 100 and the dedicated hardware units are interconnected by a bus 120. The microprocessor is thus divided into a general purpose processing section represented by DSP 100, which performs processing in software, and a set of dedicated processing blocks (in particular sub-systems 114, 115 and 119) which perform processing in hardware. The split of the microprocessor in this way significantly enhances its performance.

The input/output interfaces are as follows:

UART 101 is a standard RS232 style asynchronous serial receiver transmitter. It uses eight bit data with one start bit and one stop bit. Its purpose is mainly for development but it could be used in manufacture for self test and diagnosis.

The four NSDACs (Noise Shaped DACs) 102-105 allow the microprocessor 1 to provide up to four pulse width modulated outputs. In the system of FIG. 1 these are used for controlling the focus and tracking actuators and the spindle and sled motors of the CD system. The NSDAC logic produces a bitstream whose average value is set by the DSP. A reference output is used to eliminate any offsets so that zero output results in zero drive to the actuator.

The memory controller 106 controls the timing and data flow to external memory 16 or other similar peripherals that may be connected to the microprocessor in other implementations. The system notionally decodes three banks of external memory: the boot ROM, static RAM and dynamic RAM although the boot ROM and Static RAM decodes could be further divided for external peripherals. The timing, width (byte or word) and the number of columns in the DRAM can be programmed independently. The processor can run code from fast internal RAM as well as slower boot ROM which gives it the characteristics of a DSP and a micro-controller. In use, when the microcontroller is first activated the software stored in ROM 16 may be downloaded to local random access memory on the microprocessor.

The AC97 interface 107 provides an interface to the codec 5, which in this implementation is an AC97 codec. The codec 5 has 16 bit stereo ADCs and DACs as well as independent adjustment of gain on five stereo inputs and the stereo output. Communication with the AC97 is via a 256 bit packet operating at 256 times the audio sample rate. The AC97 interface 107 allows the D8P 100 to communicate with the AC97 by reading and writing registers at the 44.1 kHz audio sample rate.

The I2S port 108 provides a link to the I2S interface 10. I2S is a standard form of serial interface for CD quality DACs. As described above, this interface may be used to record audio to tape while the main AC97 audio output drives the power amplifiers (at variable tone and volume settings).

The infra-red input 109 is connected to infra-red detector 30. The input port 109 measures the time between specified infra-red transitions to detect and interpret an infra-red command, and then interrupts the processor 100 so the infra-red command can be processed. By this means the infra-red handset can provide a user with the normal controls such as volume adjustment audio source selection, radio band and channel selection, tone adjustment and tape and CD position and play control.

The serial interface (SPI) 110 is connected to the serial link 33 and allows the DSP 100 to communicate with serial controller 20. By means of this interface the DSP 100 can issue commands to control the outputs of the serial controller 20. This provides a convenient way for the operation of the radio tuner and the CD player to be controlled without the need for the microprocessor 1 itself to have direct links to those devices. To enable the CD player, the DSP 100 sends a signal over bus 120 to the SPI 110 to cause the SPI to transmit a CD enable signal over serial link 33. The serial controller stores a CD enable flag. On receiving the CD enable signal the serial controller sets the CD enable flag and enables the CD by means of the output signal at 310. To disable the CD player, the DSP 100 sends a signal over bus 120 to the SPI 110 to cause the SPI to transmit a CD disable signal over serial link 33. On receiving the CD disable signal the serial controller resets the CD enable flag and disables the CD by means of the output signal at 310. Similarly, the serial controller stores flags for operations of the radio tuner 2, such as a tuner enable flag and a band selection flag, which are controlled by corresponding messages from the SPI 110. Additional flags can be stored and additional functions provided by the serial controller 20. This arrangement allows the number of outputs from the microprocessor 1 to be reduced. Instead of the microprocessor itself having individual output pins for each of the signals provided by the serial controller 20, there is a simple serial interface between the microprocessor 1 and the serial interface 20.

The general purpose 110 (GPIO) block 111 represents a number (e.g. 64) of general purpose 110 pins. These can be used as inputs or outputs. They could be used for driving displays, reading switches or (relatively) slow communication with peripherals. GPIO block is connected to switch matrix 7 and display 11. Because a large number of pins is provided, each of which can be independently controlled by the DSP 100 under software command, the GPIO block provides a convenient means for allowing the microprocessor to be adapted for different implementations which might have different display units and different switch inputs. Once the GPIO block has been connected to those devices, the interaction between the DSP 100 and the devices is dependant on the software that is used.

The cassette noise shaped DAC (CDAC) 113 is intended to allow manufacturers of hi-fi systems that use the microprocessor 1 to provide a lower cost tape recording solution. The structure of the block is the same as the NSDAC but these blocks run at 44.1 KHz. If the CDAC outputs are used then no external I2S DAC is required, and the cassette recording signals at 412, 413 in FIG. 1 can be provided directly from the CDAC 113 of the microprocessor 1. This can reduce circuit board area, component count and manufacturing cost.

The CD processing sub-system 114 performs decoding of data received from the CD player 3 to derive the audio data recovered from a CD. The CD processing sub-system 114 comprises digital phase locked loop (DPLL) 130, shift register (SR) 131, fourteen-to-eight decider (FED) 132, subcode module 133, data buffer 134 and a timing and control module 135 which controls the units 130-134. The digital phase locked loop 130 recovers the bit clock from the CD data. Transitions in the CD data should occur on clock transitions. This logic synthesises a recovered clock and if the data is early or late either increases or decreases the recovered clock frequency to compensate. The recovered clock is synchronous to the system clock. This introduces a jitter of +1− half system clock period. With a 67 MHz-system clock this represents about 1% of the minimum interval between 11 data transitions. The DPLL frequency can be read by the DSP to control the speed of the disk. The DPLL initial frequency and the gain in the proportional and integral feedback paths can all be set by the DSP to control acquisition time and stability. The shift register converts the serial data from the disk into parallel symbols. It is also used to detect synchronisation symbols. The fourteen-to-eight decoder transforms data from the fourteen bit format in which it is stored on a CD into an eight bit (byte) format for use in the DSP 100. When CD data is recorded each eight bit byte is encoded onto fourteen channel bits. Each channel bit corresponds to a transition in the recorded data. The FED therefore translates each set of fourteen received channel bits into a single eight bit byte of audio data. The recovered bytes are passed to the subcode module and to the data buffer. The subcode module 133 detects subcode synchronisaton symbols and extracts the subcode byte from every received frame. The subcode module is connected to the data bus 120 for outputting the subcode information. The data buffer 134 buffers the received audio data for improving the efficiency of de-interleaving, which is performed by the DSP 100. Data from the CD is written into one of three buffers in the data buffer 134 in turn. Each of those buffers accommodates 32 bytes, or one frame of received audio data. The data buffer 134 is connected to the bus 120, by means of which the DSP 100 can access the buffers of the data buffer 134. The data buffer 134 is configured so that the DSP cannot access the buffer to which received data is currently being written, but can access the previous two buffers to which data was written. This allows the DSP to execute the first stage of deinterleaving without copying the data.

The RDS processing subsystem 115 extracts RDS data from received radio signals and provides the RDS data at the bus 120.

There are three Sigma Delta ADCs 325-327 in the CD system 3 (see FIG. 1) which provide signals representing focus error 328, tracking error 329 and central aperture 330. These signals are each in the form of a bitstream which represents the magnitude of the respective signal. Each of the sigma delta inputs 116-118 is connected to a respective one of the ADCs 325-327. The sigma delta inputs repeatedly count the binary ones in the respective bitstream over a preset sample period, and provide the result of each count to the data bus 120. The results can be used by the DSP 100 for determining focus and tracking error so as to control the focus and radial servos 303, 302 by means of two of the NSDACs 102-105. The results (particularly of the central aperture count) can also be passed over bus 120 to the DPLL 130, as the basic data input to the CD sub-system 114.

The DSP 100 performs Reed-Solomon error correction of data received from the CD subsystem 114 under the control of software from ROM 16. In the course of the error correction operation the DSP 100 is required to determine syndromes for the received data. This could be performed in software, but to "add" one byte to a current syndrome would take around 20 instructions in software. At GD data rates this would consume around 10 million instructions of the DSP 100 per second. The error correction accelerator (EGG) block is provided to accelerate the process. The EGG block can communicate with the DSP 100 over data bus 120. The EGG block implements syndrome calculation and in response to a message from the DSP 100 returns a message indicating the byte that is to be added to the current syndrome. This accelerates the task of syndrome computation by reducing the load on the DSP 100 for syndrome determination to one instruction per received data byte.

The DSP 100 operates at a clock speed of 67 MHz, but other rates could be used. The DSP 100 is a general purpose processor which operates under software control to receive data over bus 120, process it and output data over the same bus.

Figure 3:
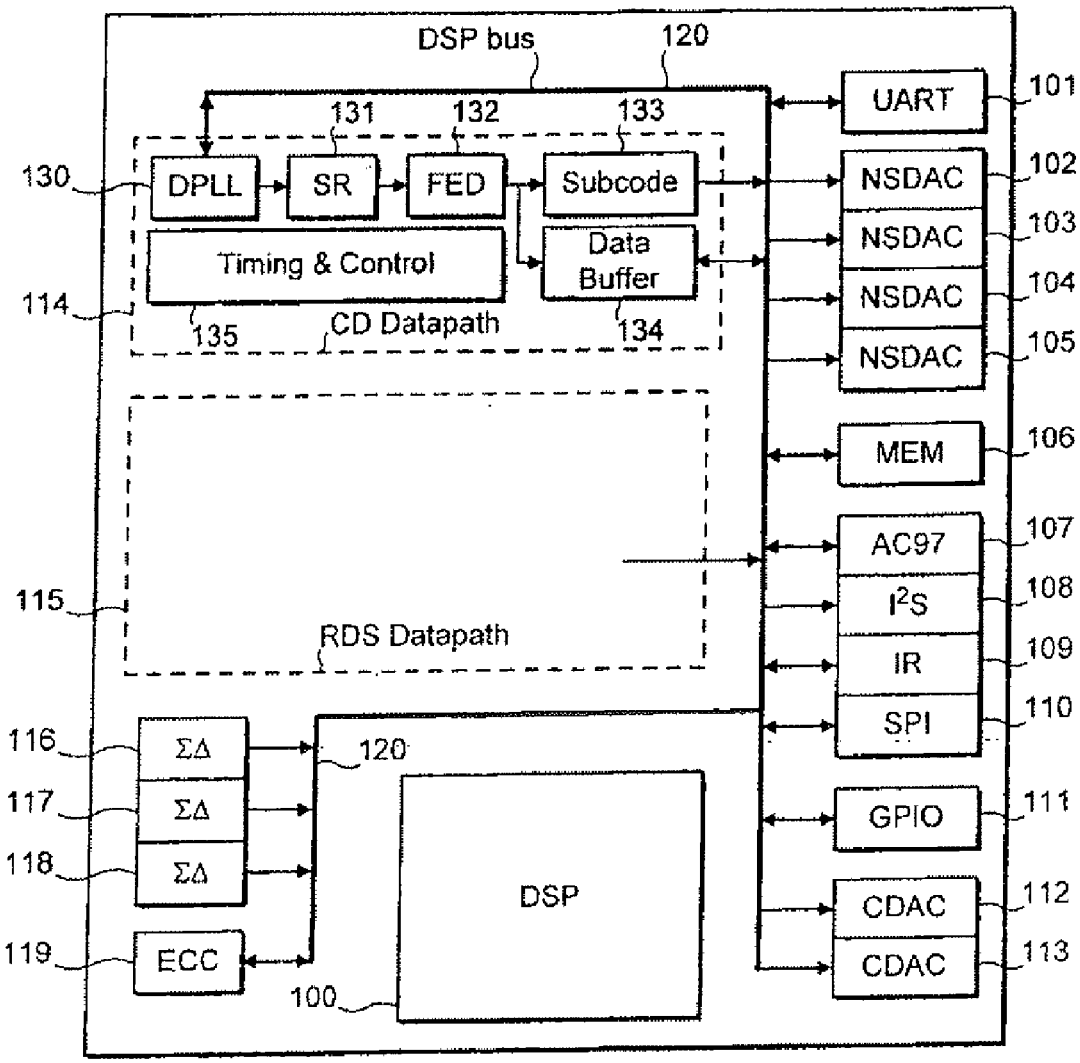
FIG. 3 shows the architecture of an integrated circuit for use in the system of FIG. 2.
Figure 2A:
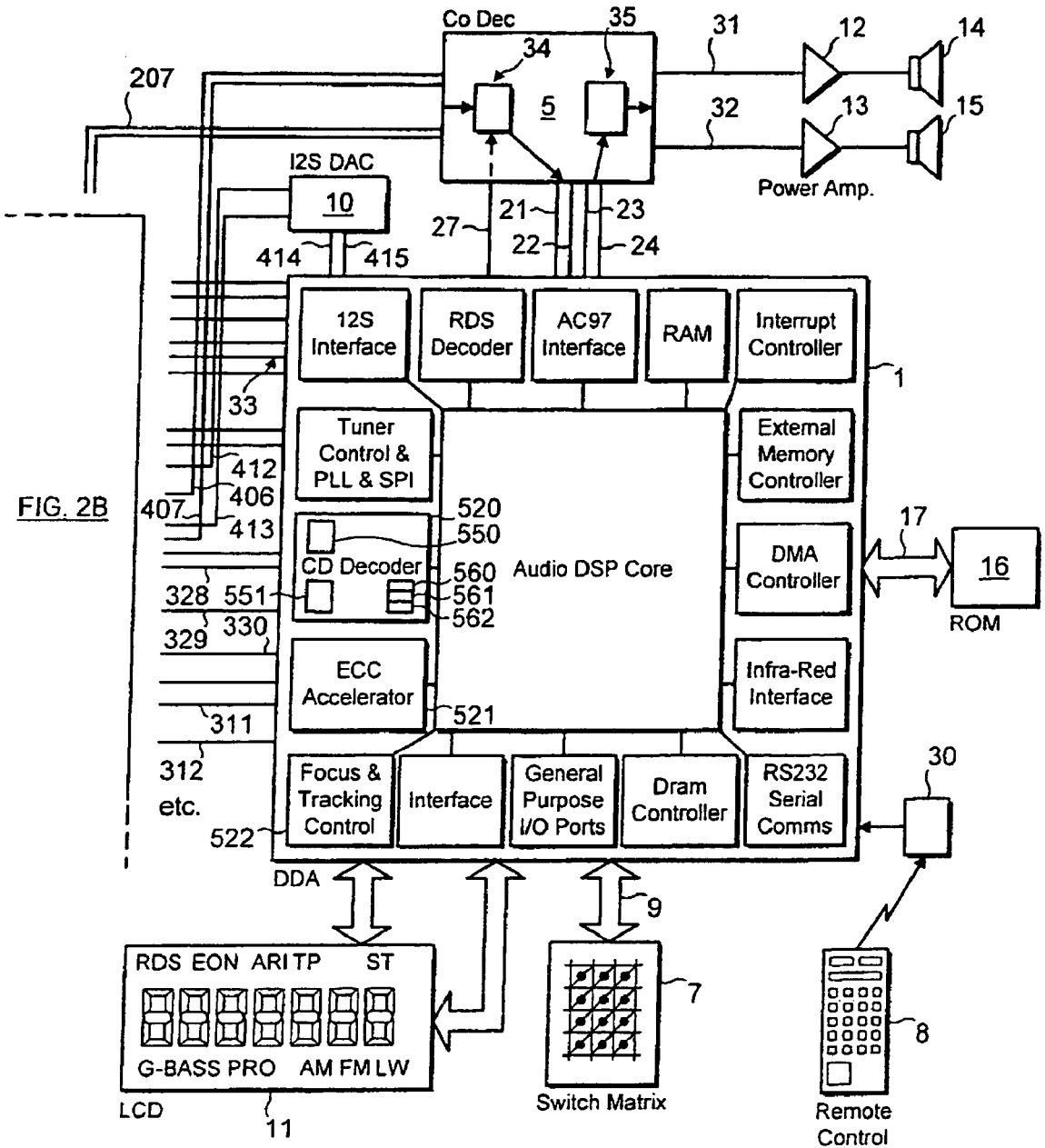
FIG. 2 shows the general architecture of an audio system.
Figure 2B:
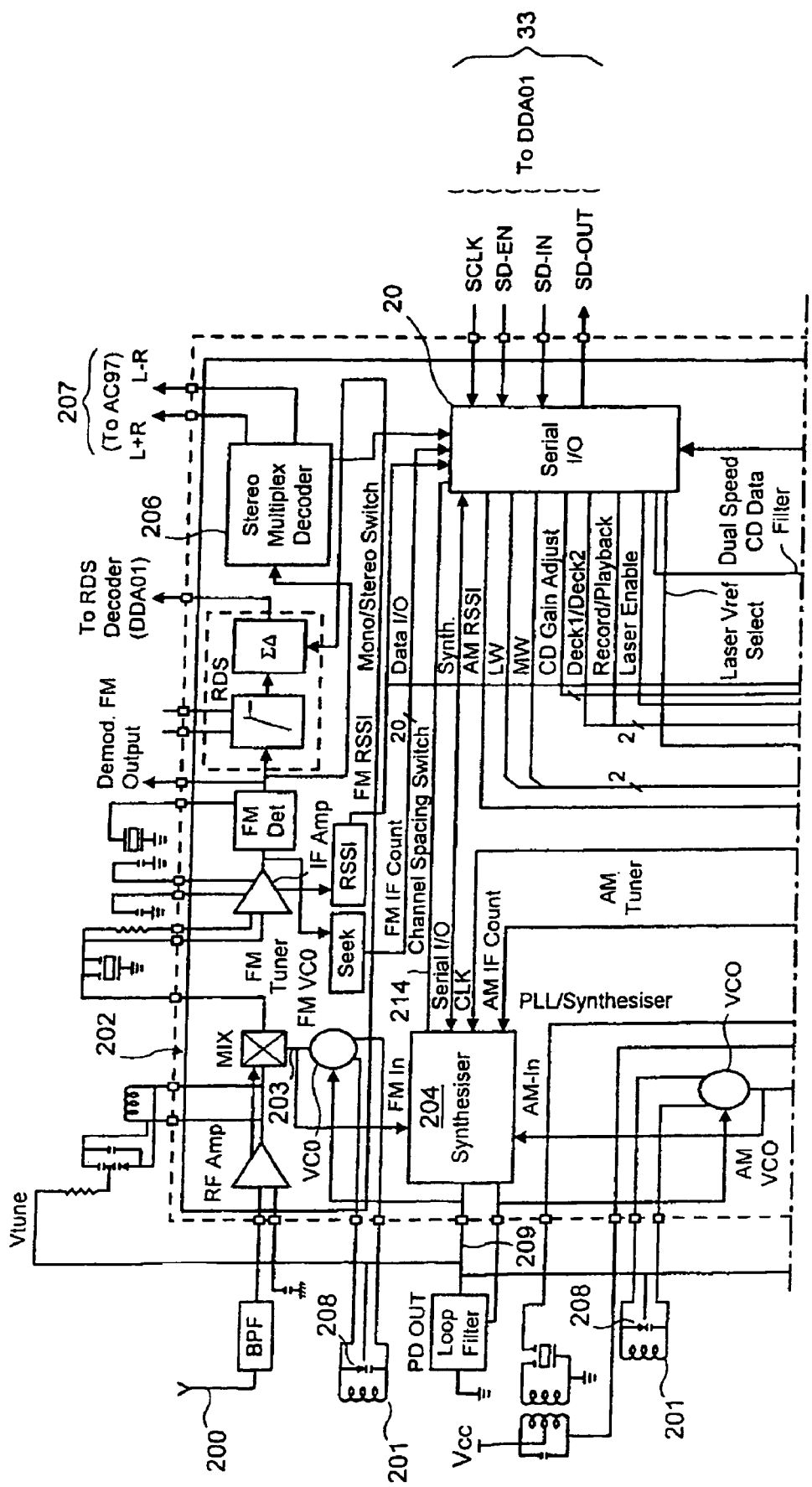
Figure 2B:
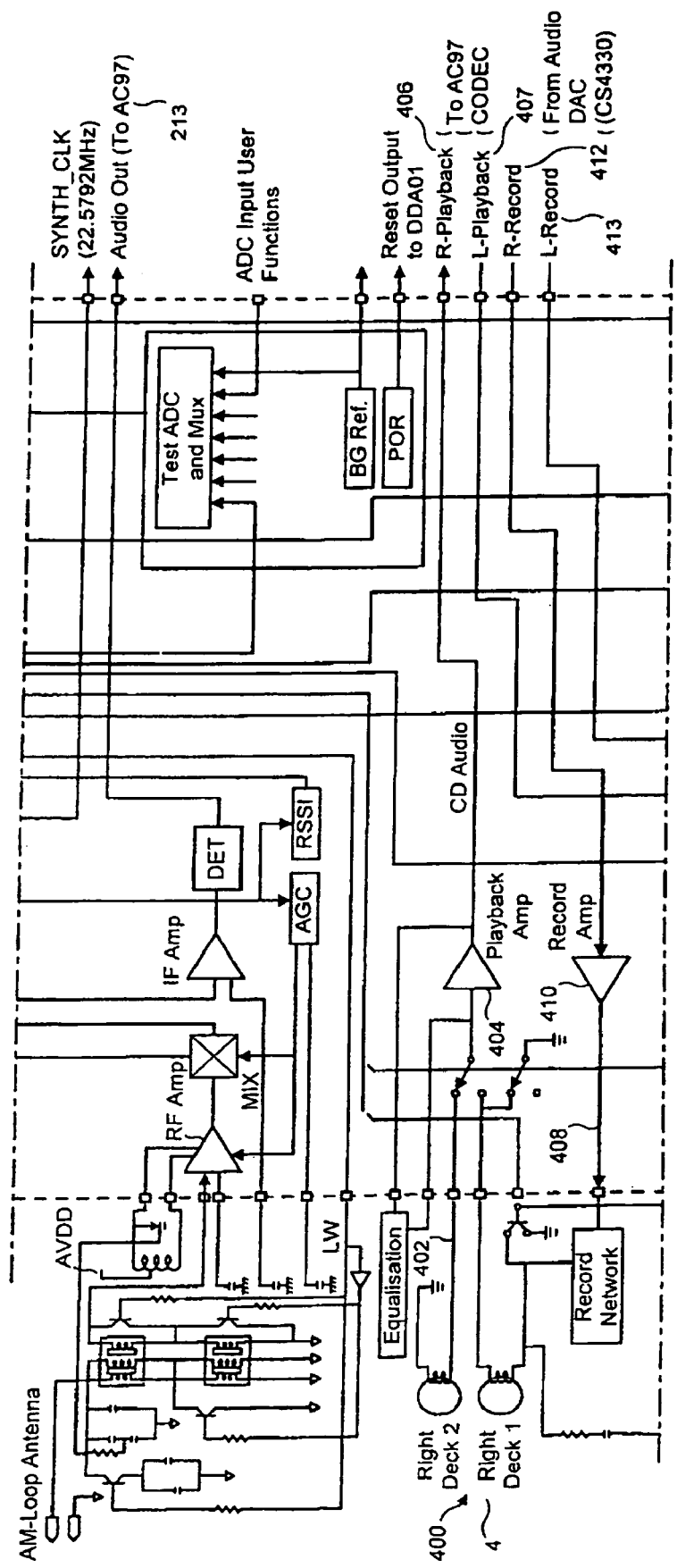
Figure 2B:
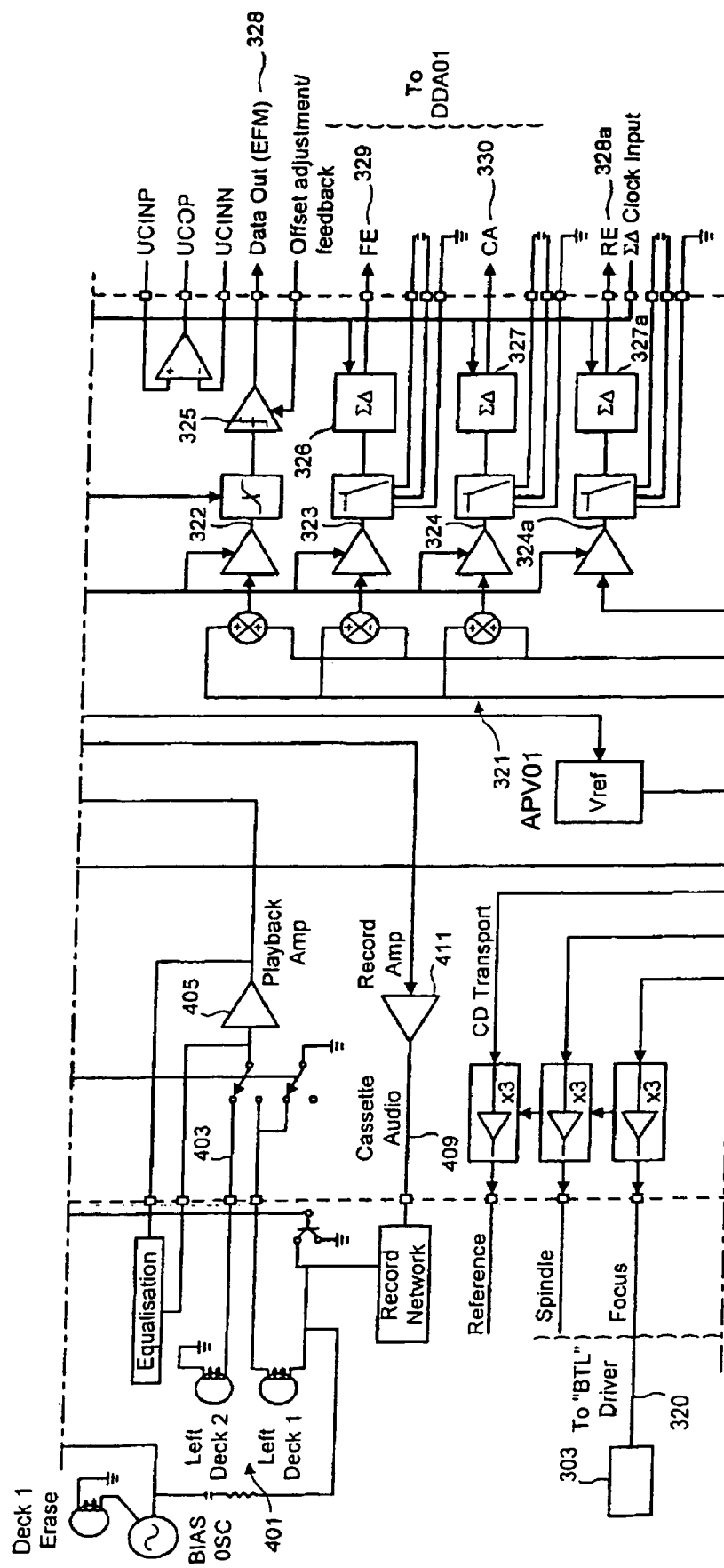
Figure 2B:
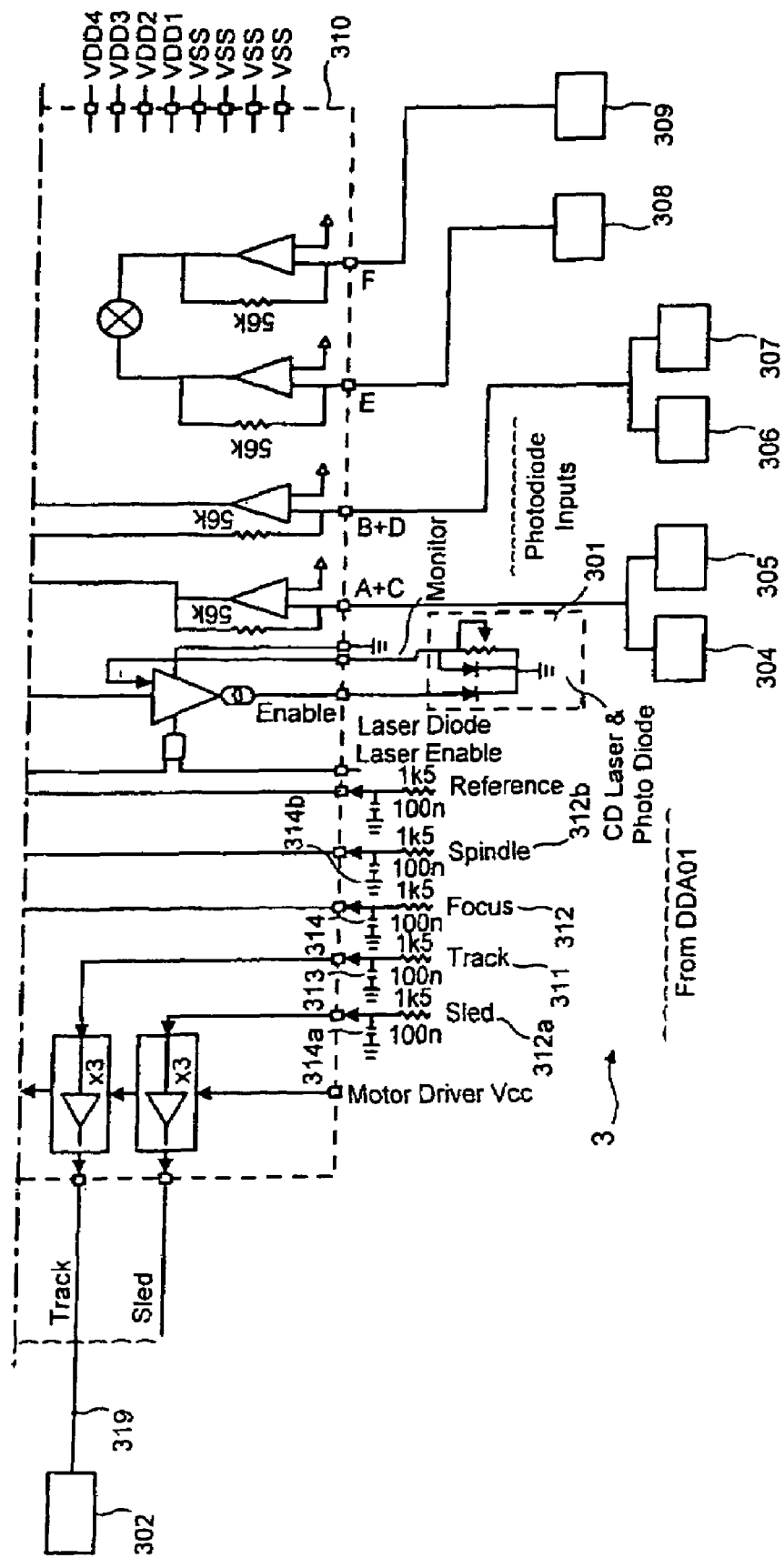

The architecture of the DSP 100 is shown in FIG. 3. The DSP has eight 32 bit registers 160. These can be used to hold addresses or data. When a register is used to provide an address it is combined with a five bit offset (indexed addressing) allowing single cycle access to small data structures. The DSP 100 includes a 32 bit arithmetic logic unit (ALU) 161. RAM 162-164 for the DSP 100 could be provided on the integrated circuit of microprocessor 1 or on external 13 RAM chips. The RAM may be a mixture of SRAM and DRAM. There are three banks decoded by the external memory controller, two static and one dynamic. The speed and width of each bank may be independently adjusted. External memory may be 8 or 16 bits wide. The external memory controller conceals this to an extent and allows 8 or 16 bit access to the external memory. After reset the processor executes instructions from one bank of static memory. It is intended that code for speed critical operations (like digital filters) be transferred into and executed from fast internal program RAM while code for slow operations (like the user interface) be executed directly from the boot EPROM. In addition, the DPS includes SP and PC registers 165, flag stores 166, a dedicated bit shifter unit 167, a dedicated multiplier unit 168 and an external memory controller 169. The blocks of the DSP are connected by bus 170.

In operation, a user enables the audio system of FIG. 1 by turning on power to the system. With the exception of the remote control handset 8, which is battery-powered, all the apparatus in the audio system has a common power supply (not shown in the figures), although different components of the system may have different power voltages derived from that power supply. When it is turned on the microprocessor 1 boots up and loads operating software from ROM 16. increase the speed of execution the software may be stored in local RAM. To means of the switch matrix 7 and/or the remote control 8 the user can provide to the DSP 100 data indicating the following information:

which of the audio input units 2, 3, 4 is to provide the audio source for replay through the speakers 14, 15;

if the source is the CD or tape player, whether the unit is in play, or pause or stop mode, or is to index forwards or backwards;

the settings of volume, tone and other processing effects with which the sound is to be replayed;

whether the sound is also to be recorded by the cassette player/recorder 4.

Other information may also be provided. The user's settings are provided to the GPIO block 111 of the microprocessor 1, and thence via the bus 120 to the DSP 100 which stores the settings in RAM so that they are available during execution of software.

If the radio tuner is selected as the audio source then the DSP 100 transmits the appropriate tuner enable and selection signals to serial controller 20 via port 110. The tuner is then enabled by the serial controller 20. Analogue audio signals from the tuner are converted into the digital domain by codec 5 and provided to the AC97 interface 107. From there the digital signals are passed over bus 120 to DSP 100 which transforms them under control of its program software in accordance with the user's settings for volume, tone etc. In addition, and particularly if FM radio signals are being received, the digital audio signals are subjected to frequency equalisation to account for any compression or the like that may be in use for transmission of the signals. The software of the DSP 100 includes one or more preset processing routines for radio equalisation and the appropriate routine is used to equalise the received audio data. The resulting signals are output to the codec 5 via the AC97 interface 107. The AC97 interface converts the signals back into the analogue domain and outputs them to the amplifiers and speakers 12-15.

If the CD player is selected as the audio source then the DSP 100 transmits the appropriate CD player enable and selection signals to serial controller 20 via port 110. The CD player is then enabled by the serial controller 20. Meanwhile, the DSP 100 controls the servos of the CD player directly via NSDACs 102-105. Raw bitstream data from the CD player is received by the microprocessor 1 at sigma delta inputs 116-118. By means of the data bus 120 this data is provided to DSP 100 and to the CD sub-system 114. The DSP uses the data to determine any tracking or focus error and adjusts the outputs to the tracking and focus servos accordingly. Meanwhile, the CD sub-system decodes the received data into eight bit bytes which are stored in the buffers of the data buffer 134. The DSP 100 reads from those buffers as described above, to perform deinterleaving of the received data, and then performs error correction on the received data to yield the pulse code modulated digital audio data from the CD. That data may then by converted by the DSP 100 into another digital audio form. The digital audio data from the is then transformed by the DSP 100 under control of its program software in accordance with the user's settings for volume, tone etc. The resulting signals are output to the codec 5 via the AC97 interface 107. The AC97 interface converts the signals back into the analogue domain and outputs them to the amplifiers and speakers 12-15.

If the cassette player/recorder is selected as the audio source then the DSP 100 transmits the appropriate cassette player/recorder enable and selection signals to serial controller 20 via port 110. The cassette player/recorder is then enabled by the serial controller 20 by means of signals not shown in FIG. 1. Analogue audio signals from the cassette player/recorder are converted into the digital domain by codec 5 and provided to the AC97 interface 107. From there the digital signals are passed over bus 120 to DSP 100 which transforms them under control of its program software in accordance with the user's settings for volume, tone etc. In addition, the digital audio signals are subjected to frequency equalisation to account for the type of cassette tape in use. The type of tape may be input by the user or detected by the tape deck and provided to the microcontroller via interface 111. The software of the DSP 100 includes preset processing routines for tape equalisation and the appropriate routine is used to equalise the received audio data. The resulting signals are output to the codec 5 via the AC97 interface 107. The AC97 interface converts the signals back into the analogue domain and outputs them to the amplifiers and speakers 12-15.

If the user has indicated that the cassette player/recorder is to record from the selected audio source then in addition to being output to the codec 5 via the AC97 interface 107 the resulting signals are output to the 128 interface 10 via 128 port 108. In the 128 interface the signals are converted back into the analogue domain and output to the cassette player/recorder. The signals as output to the 128 interface may not be subject to some of the processing used on signals to the codec 5. For example, volume and tone processing may be not applied to them. It is preferred that the appropriate tape type equalisation is applied to the signals.

In addition to the audio processing described above, the DSP 100 provides outputs to the display to indicate its status. The outputs may provide confirmation of user inputs, such as volume or radio band settings, or may indicate data derived from the audio source in use, for example CD track data or RDS data.

It will be appreciated that the system of FIG. 1 may be varied in numerous ways. For example, the speakers 14, 15 could be replaced by or supplemented with headphones or another means of providing audible signals. Additional or different audio sources such as minidisc or DVD (digital video disc) players could be provided.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

The invention claimed is:

1. A reading unit for reading data from a digital data carrier, the reading unit comprising:
    a reading head including a sensor for sensing data from the data carrier and generating a sensor signal indicative of the sensed data;
    a head positioning apparatus for positioning the reading head relative to the data carrier in response to a head positioning control signal;
    a head positioning controller for generating the head positioning control signal by processing the sensed data; and
    a data decoder for decoding the sensed data to form a digital output signal, the data decoder comprising:
    a memory including an instruction set for instructing a data processor to process a stream of data bytes generated in response to the sensed data; and
    a de-interleaving unit including three buffers for sequentially storing the stream of data bytes, wherein the de-interleaving unit is configured to de-interleave the stream of data bytes by:
    filling a first one of the three buffers with successive data bytes from the stream of data bytes; and
    forming an output stream by alternatingly reading data bytes from the other two of the three buffers.

2. The reading unit of claim 1, wherein the digital data carrier is a disc.

3. The reading unit of claim 2, wherein the digital data carrier is a compact disc, digital versatile disc or minidisc.

4. The reading unit of claim 1, wherein the head positioning apparatus comprises a spindle motor for rotating the data carrier.

5. The reading unit of claim 1, further comprising an error checking unit, wherein the error checking unit is configured to receive error checking input data and, in response to the error checking input data, generate a syndrome for use in Reed-Solomon error correction.

6. The reading unit of claim 5, wherein the memory includes an instruction set for instructing a data processor to apply data derived from the sensed data to the error checking unit, receive the resultant syndrome, and process the syndrome to perform an error checking operation on the data derived from the sensed data.

7. The reading unit of claim 1, comprising a fourth buffer for storing data derived from the sensed data.

8. The reading unit of claim 1, wherein each of the three buffers has a capacity of 32 bytes.

9. The reading unit of claim 1, further comprising a data packaging unit configured to receive a 14-bit byte and generate a corresponding 8-bit byte in response to the 14-bit byte.

10. The reading unit of claim 1, wherein the data decoder, the memory, and the de-interleaving unit reside in one integrated circuit.

11. The reading unit of claim 1, further comprising a digital phase locked loop for generating a clock signal to synchronize the decoder with the sensed data.

12. The reading unit of claim 1, further comprising a cyclic redundancy check unit for analyzing a data word by performing a cyclic redundancy check.

13. The reading unit of claim 1, further comprising a data packaging unit for packaging data bytes comprising a first number of bits to form data bytes having a second, lesser number of bits.

14. The reading unit of claim 1, wherein the de-interleaving unit is configured such that at least a portion of a time in which the first one of the three buffers is being filled overlaps with a portion of a time in which an output stream is being read from the other two of the three buffers.

15. The reading unit of claim 1, wherein the de-interleaving unit is configured to fill any one of the three buffers substantially simultaneously with forming an output stream from the other two of the three buffers.

16. A reading unit for reading data from a digital data carrier, the reading unit comprising:
    a reading head including a sensor for sensing data from the data carrier and generating a sensor signal indicative of the sensed data;
    a head positioning apparatus for positioning the head relative to the data carrier in response to a head positioning control signal;
    a head positioning controller for receiving the sensed data and being operable in accordance with a stored instruction set to process the sensed data to generate the head positioning control signal; and
    a data decoder for decoding the sensed data to form a digital output signal, the data decoder comprising:
    a software section comprising a data processor operable to process data generated in response to the sensed data in accordance with a stored instruction set; and
    a hardware section comprising a dedicated hardware de-interleaving unit configured to de-interleave a stream of data bytes, wherein the de-interleaving unit comprises three buffers, and the de-interleaving unit is configured to receive a stream of data bytes and to simultaneously store successive received data bytes in any one of the buffers and generate an output data stream in which successive data bytes are formed by reading data from alternate ones of the other two of the buffers.

* * * * *

UNITED STATES PATENT AND TRADEMARK OFFICE
CERTIFICATE OF CORRECTION

| | | |
|---|---|---|
| PATENT NO. | : 7,636,281 B2 | Page 1 of 1 |
| APPLICATION NO. | : 10/398550 | |
| DATED | : December 22, 2009 | |
| INVENTOR(S) | : Martin John Brennan | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1232 days.

Signed and Sealed this

Twenty-first Day of December, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,636,281 B2 | Page 1 of 1 |
| APPLICATION NO. | : 10/398550 | |
| DATED | : December 22, 2009 | |
| INVENTOR(S) | : Martin John Brennan | |

It is certified that error appears in the above-identified patent and that said Letters Patent is hereby corrected as shown below:

Before the paragraph beginning on column 1, line 3, insert as a new paragraph --This application is a national stage application under 35 U.S.C. § 371 of International Application No. PCT/GB2001/004405, filed October 3, 2001, which claims priority to Great Britain Application No. GB 0024293.3, filed October 4, 2000.--

Signed and Sealed this
Twenty-fifth Day of January, 2011

David J. Kappos
*Director of the United States Patent and Trademark Office*